(12) United States Patent
He et al.

(10) Patent No.: US 7,333,341 B2
(45) Date of Patent: Feb. 19, 2008

(54) HEAT DISSIPATION DEVICE

(75) Inventors: Li He, Guangdong (CN); Tsung-Lung Lee, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 194 days.

(21) Appl. No.: 11/163,710

(22) Filed: Oct. 27, 2005

(65) Prior Publication Data

US 2006/0256532 A1    Nov. 16, 2006

(30) Foreign Application Priority Data

May 14, 2005    (CN) .......................... 2005 2 0058507

(51) Int. Cl.
*H05K 7/20* (2006.01)

(52) U.S. Cl. .................. 361/719; 24/457; 248/505; 248/510; 257/719; 361/690; 361/697; 361/704; 165/80.3; 165/185; 165/121

(58) Field of Classification Search ............... 361/719
See application file for complete search history.

(56) References Cited

U.S. PATENT DOCUMENTS

| 6,205,026 | B1 * | 3/2001 | Wong et al. ................. 361/704 |
| 6,471,533 | B2 | 10/2002 | Lai et al. |
| 6,758,692 | B2 * | 7/2004 | Walkup et al. .............. 439/485 |
| 2005/0199370 | A1 * | 9/2005 | Huang ........................ 165/80.3 |

\* cited by examiner

*Primary Examiner*—Gregory D Thompson
(74) *Attorney, Agent, or Firm*—Winston Hsu

(57) ABSTRACT

A heat dissipation device includes a heat sink, a retention module and a clip securing the heat sink to the retention module. The retention module includes a bottom wall and a plurality of sidewalls surrounding the bottom wall. The heat sink includes a plurality of the fins and a plurality of passages defined therebetween. The heat sink is located on the bottom wall of the retention module. The sidewalls of the retention module surround a bottom portion of the heat sink. The sidewalls define a plurality of voids therein for an airflow generated by a fan mounted on the heat sink passing therethrough. The airflow flows through the heat sink and then the voids in the sidewalls of the retention module to cool electronic components located beside the retention module.

15 Claims, 5 Drawing Sheets

_US 7,333,341 B2_

HEAT DISSIPATION DEVICE

FIELD OF THE INVENTION

The present invention relates generally to a heat dissipation device, and more particularly to a heat dissipation device incorporating a retention module for securing the heat dissipation device to a heat generating electronic device.

DESCRIPTION OF RELATED ART

It is widely acknowledged that heat is produced during operation of electronic devices such as central processing units (CPUs). The heat produced must be quickly removed to ensure the CPUs to work normally. Typically, a heat dissipation device is provided to remove heat from the CPU. In order to keep the heat dissipation device intimately contacting with the CPU, a locking device is generally incorporated in the heat dissipation device to secure the heat dissipation device to the CPU.

Conventionally, a locking device comprises a retention module and a clip. Generally, the retention module is a substantially rectangular frame and located around the electronic device on a printed circuit board. The retention module comprises a bottom wall and four interconnecting sidewalls extending from four sides of the bottom wall. The bottom wall has an opening defined in a center thereof for receiving the electronic device. A heat sink is located on the electronic device in the retention module. The four sidewalls of the retention module surround a bottom portion of the heat sink. Usually, in order to improve heat dissipation efficiency of the heat dissipation device, a fan is attached to the heat sink to provide forced airflow to the heat sink.

However, speedy upgrading trend in computer industry causes electronic devices to become more integration and powerful function, which results in more heat produced by the electronic devices. Particularly for the electronic components, such as Mosfets and capacitors, which are located beside the retention module, they also generate heat needing to be dissipated. However since these electronic components are very small in sizes, they are difficult to be mounted with heat sinks. Usually, these electronic components are cooled by virtue of the force air flow generated by the fan of the heat dissipation device for the CPU. However, due to blocking of the forced airflow by the heat sink and the retention module of the heat dissipation device of the CPU, only a limited amount of the airflow provided by the fan can reach these electronic components located beside the retention module. Consequently, only a little amount of heat generated by these electronic components is removed. The heat dissipation effectiveness of these electronic components is not good enough and needs further improvement. Therefore, the heat dissipation device needs to be improved to have a better effect in dissipating heat generated by the electronic components located beside the retention module.

What is needed, therefore, is a heat dissipation device incorporating a retention module which can effectively dissipate heat generated by electronic components located both in and beside the retention module.

SUMMARY OF INVENTION

A heat dissipation device in accordance with a preferred embodiment of the present invention comprises a heat sink, a retention module and a clip securing the heat sink to the retention module. The retention module comprises a bottom wall and a plurality of sidewalls surrounding the bottom wall. The heat sink comprises a plurality of the fins and a plurality of passages defined between the fins. The heat sink is located on the bottom wall of the retention module. The sidewalls of the retention module surround a bottom portion of the heat sink. The sidewalls define a plurality of voids therein for airflow passing therethrough. The voids extend through inner and outer faces of the sidewalls. The voids of the sidewalls communicate with the passages of the heat sink and an ambient environment out of the retention module. The heat sink thermally contacts with a main heat-generating electronic component located in the retention module. Pluralities of secondary heat-generating electronic components are positioned beside the retention module. A fan is mounted on the heat sink. An air flow generated by the fan flows through the heat sink to remove heat of the main heat-generating electronic component, and the voids of the retention module to remove heat of the secondary heat-generating electronic components.

Other advantages and novel features of the present invention will become more apparent from the following detailed description when taken in conjunction with the accompanying drawings, in which:

DETAILED DESCRIPTION

Figure 1:
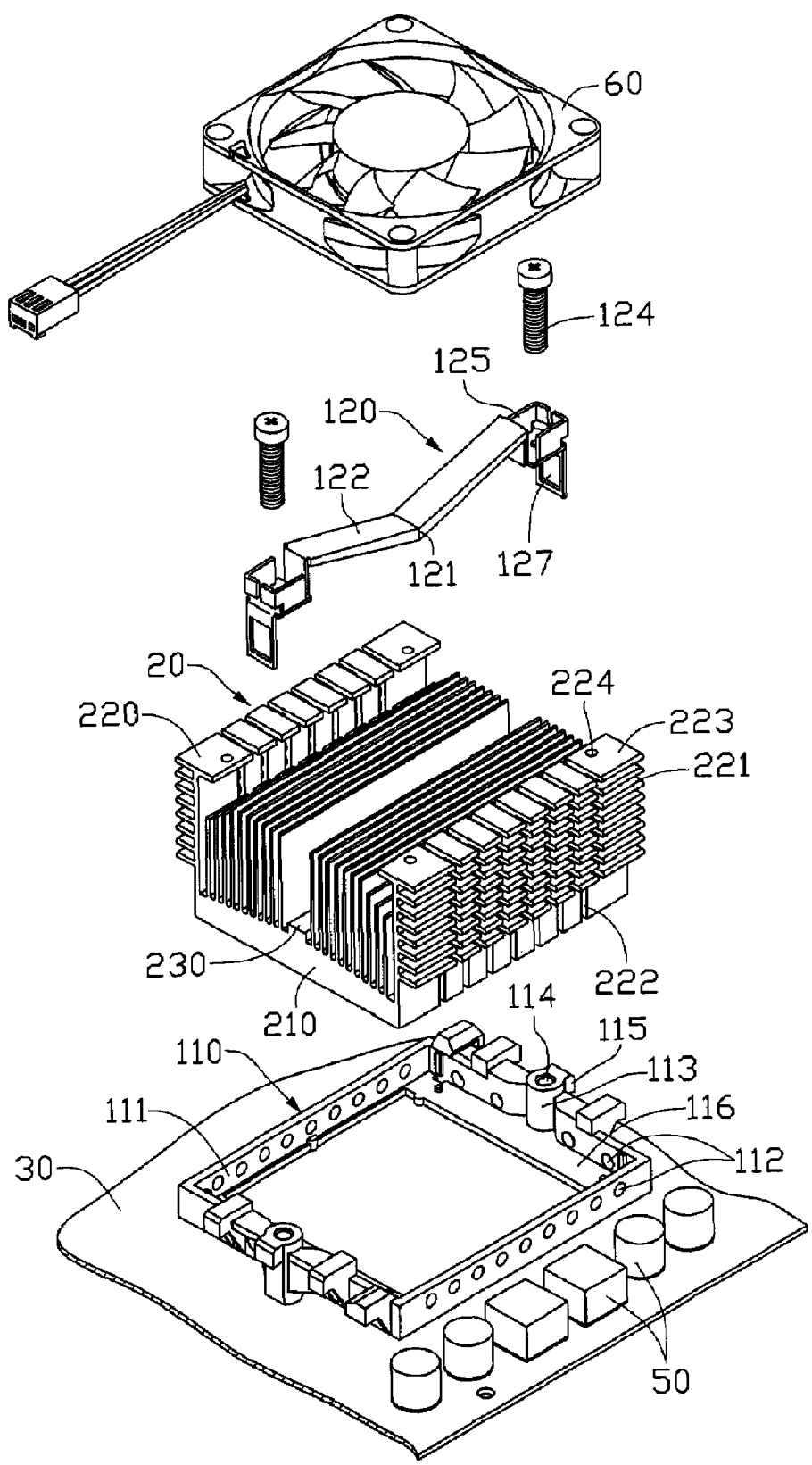
FIG. 1 is an exploded, isometric view of a heat dissipation device in accordance with a first embodiment of the present invention, and a printed circuit board and a plurality of electronic components mounted on the printed circuit board.
Figure 2:
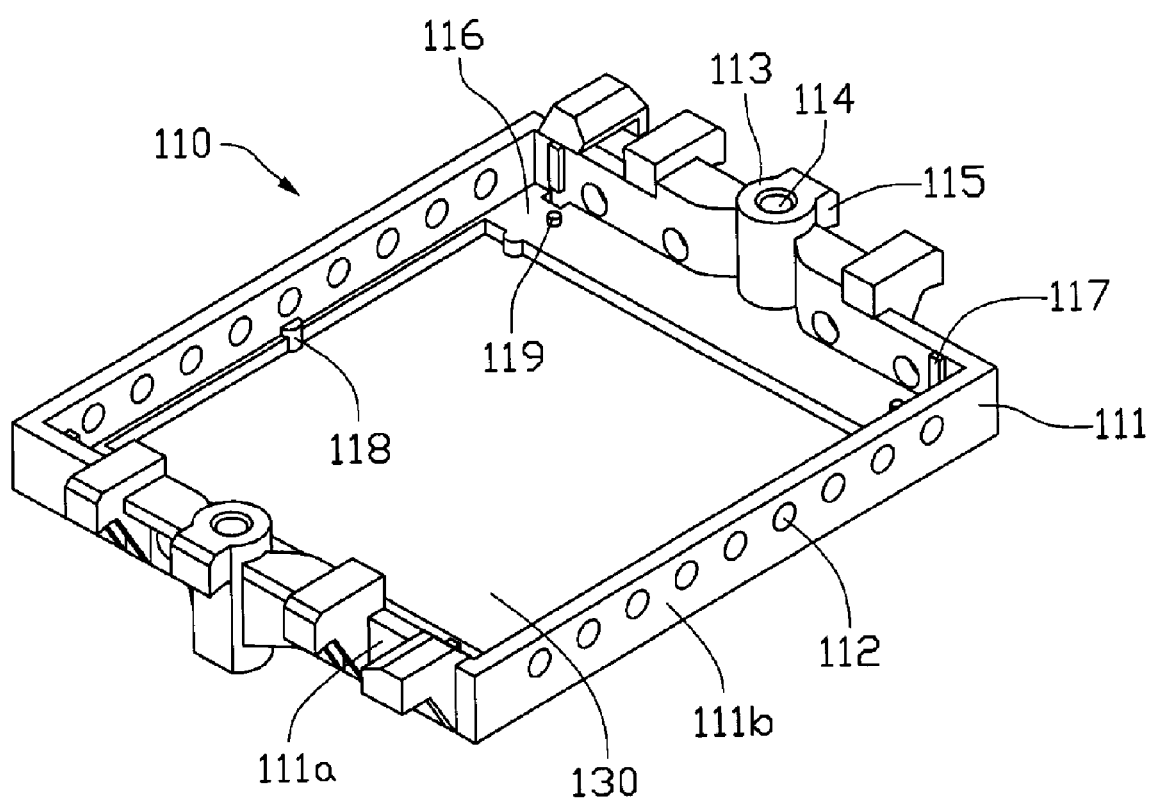
FIG. 2 shows a retention module of the heat dissipation device of FIG. 1.
Figure 3:
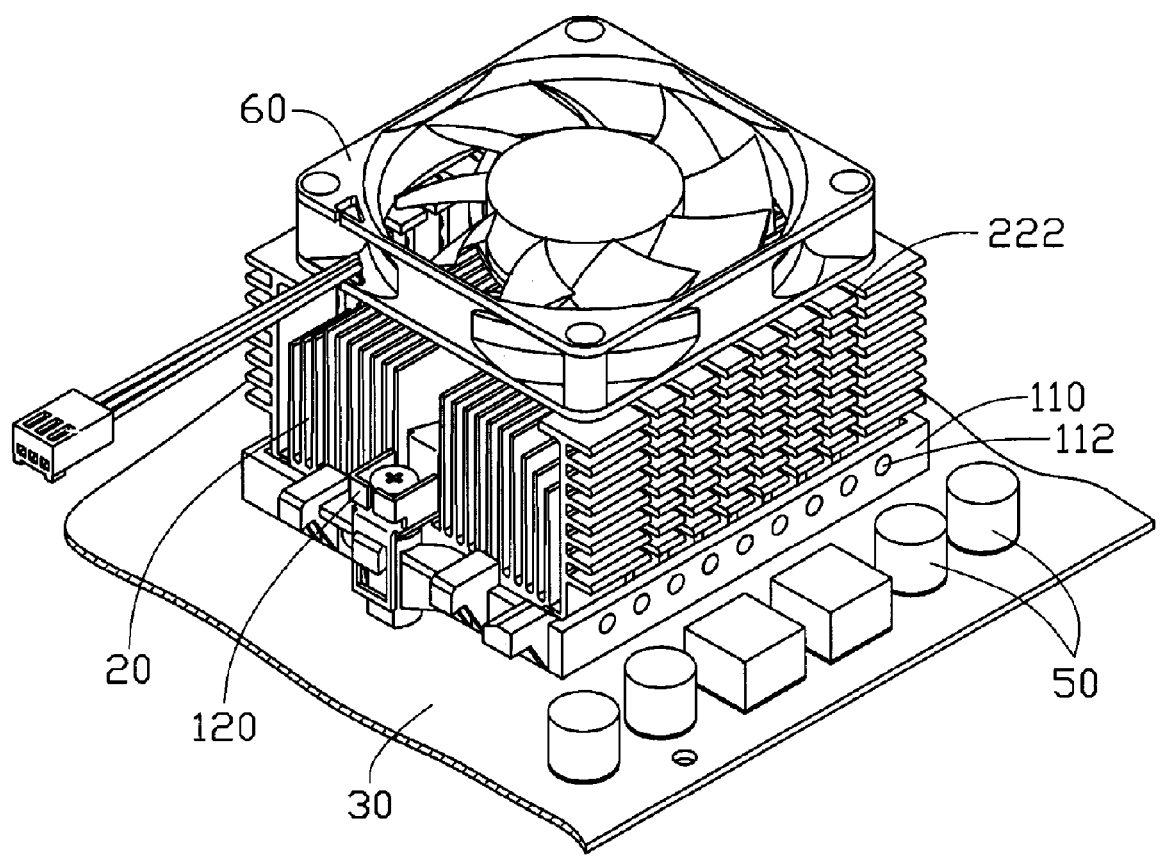
FIG. 3 is an assembled view of FIG. 1.

Referring to FIGS. 1-3, a heat dissipation device in accordance with a first embodiment of the present invention comprises a heat sink 20, a retention module 110 and a clip 120 cooperating with the retention module 110 to secure the heat sink 20 to a main heat-generating electronic component such as a CPU (not shown) located on a printed circuit board 30 and surrounded by the retention module 110.

On the printed circuit board 30, a plurality of secondary heat-generating electronic components such as Mosfets (Metal-oxide semiconductor field-effect transistors) 50 are located beside a lateral side of the retention module 110.

The heat sink 20 comprises a base 210 having a bottom face for contacting with the CPU and a top face opposite to the bottom face, and a plurality of fins 220 integrally extending upwardly from the top face of the base 210. The base 210 has an arced cross section, i.e., a middle portion of the base 210 being thicker than two lateral sides of the base 210. Pluralities of passages (not labeled) are defined between the fins 220. The fins 220 on the middle of the base 210 are higher than that on the lateral sides of the base 210, but two outmost fins 220 respectively at two opposite outmost sides of the heat sink 20 are the highest. Except for the two outmost fins 220 which are the highest, the fins 220 on the base 210 have an arced end at a top of the heat sink 20. A wide channel 230 without fins 220 is defined between two fins 220 in the middle portion of the base 210 for receiving the clip 120 therein. Each outmost fin 220 has pluralities of heat dissipating tabs 221 extending outwardly and horizontally. A flat plate 223 which is located at a top of one of four corners of the heat sink 20 defines a fixing hole 224 therein. A plurality of parallel and vertically extending slots 222 is defined through the tabs 221. Each of the slots 222 extends from a top to a bottom of the outmost fin 220 and further to the bottom face of the base 210 and communicates an inside of the heat sink 20 with an ambient environment outside the heat sink 20. Each of the slots 222 communicates the inside of the heat sink 20 and a space under the base 210.

The retention module 110 is a substantially rectangular frame and comprises a bottom wall 116 and four interconnecting sidewalls 111 comprising two opposite first sidewalls 111*a* at front and rear thereof and two opposite second sidewalls 111*b* at opposite lateral sides thereof. The four sidewalls 111 extend from four sides of the bottom wall 116, respectively. Each of the four sidewalls 111 defines a plurality of through holes 112 therein. The through holes 112 extend through an inner face (not labeled) through an outer face (not labeled) of each of the side walls 111 and communicate a space inside the retention module 110 and the ambient environment outside the retention module 110. Each of the first sidewalls 111*a* at a center thereof forms a post 113 with a threaded fixing hole 114 defined in a top thereof. Two opposite protrusions 115 are respectively provided at outsides of the two posts 113 of the two first sidewalls 111*a*. Two blocks 117 extend form an inner side of each first sidewall 111*a* for abutting against front and rear sides of the base 210 of the heat sink 20 when the base 210 is inserted in the retention module 110, whereby the heat sink 20 can be firmly mounted in the retention module 110. A projection 118 is formed under a middle one of the through holes 112 and at a joint of each of the second sidewalls 111*b* and the bottom wall 116, for positioning the heat sink 20. An opening 130 is defined in a center of the bottom wall 116 for receiving the CPU therein. Two studs 119 extend upwardly from the bottom wall 116 near rear ends of the two lateral second sidewalls 111*b* of the retention module 110, respectively.

The clip 120 is substantially M-shaped and comprises a pressing portion 121 at a center thereof and two extension portions 122 extending from two sides of the pressing portion 121 respectively. A fastening portion 125 with a fastening hole 127 defined in a lower end thereof depends from each of the two extension portions 122. Above the fastening hole 127, a fixing hole (not labeled) corresponding to the fixing hole 114 of a corresponding post 113 of the retention module 110 is defined in the fastening portion 125.

Particularly referring to FIG. 3, in assembly, the heat sink 20 rests on the bottom wall 116 of the retention module 110. The sidewalls 111 of the retention module 110 surround the base 210 of the heat sink 20. The studs 119 of the bottom wall 116 supporting the heat sink 20, whereby a space for airflow flowing is defined between the heat sink 20 and the bottom wall 116. The blocks 117 of the first sidewalls 111*a* form a space (not labeled) between each of the first sidewalls 111*a* and the base 210 of the heat sink 20. The spaces communicate with the holes 112 of the first sidewalls 111*a*. The projection 118 at the joint of each of the second sidewalls 111*b* and the bottom wall 116 is received in one of the slots 222 of the heat sink 20, whereby the slots 222 of the heat sink 20 are aligned with and communicate with the holes 112 of the second sidewalls 111*b*. The clip 120 is received in the channel 230 of the heat sink 20. The fastening portions 125 of the clip 120 are fastened to the retention module 110 by engaging the protrusions 115 of the retention module 110 in the fastening holes 127, respectively. Furthermore, the clip 120 is firmly fixed to the retention module 110 by extending two fasteners 124 such as screws through the fixing holes of the clip 120 to engage in the fixing holes 114 of the retention module 110. Thus, the heat sink 20 is secured to the retention module 110 and intimately contacts with the CPU. A fan 60 is secured atop the heat sink 20 by extending fasteners (not shown) such as screws through four holes (not labeled) in four corners of the fan 60 to engage in the fixing holes 224 defined in the flat plates 223 of the heat sink 20, respectively.

In use, heat generated by the CPU is firstly absorbed by the base 210 of the heat sink 20 contacting with the CPU; then, the heat reaches the fins 220. The fan 60 provides a forced airflow to the fins 220. The airflow flows through the passages between the fins 220 to have heat exchange with the fins 220; therefore, the heat in the fins 220 is removed by the airflow. A part of the airflow in the heat sink flows outwardly through the slots 222 of the heat sink 20 and the holes 112 in the sidewalls 111 of the retention module 1110 to take away heat of the Mosfets 50 therefrom. Therefore, the airflow generated by the fan 60 can cool not only the CPU but also the Mosfets 50.

In accordance with the first embodiment of the present invention, the heat sink 20 has the slots 222 defined in the outmost fins 220 and the base 210, and the retention module 110 has the holes 112 defined in the sidewalls 111 thereof. Considerable amount of airflow provided by the fan 60 can flow out of the heat sink 20 to the Mosfets 50 beside the retention module 110 via the slots 222 and the holes 112. In comparison with the conventional heat dissipation device, the heat dissipation device of the present invention has more air flowing to the Mosfet 50, which can more effectively dissipate the heat generated by the Mosfets 50.

Figure 4:
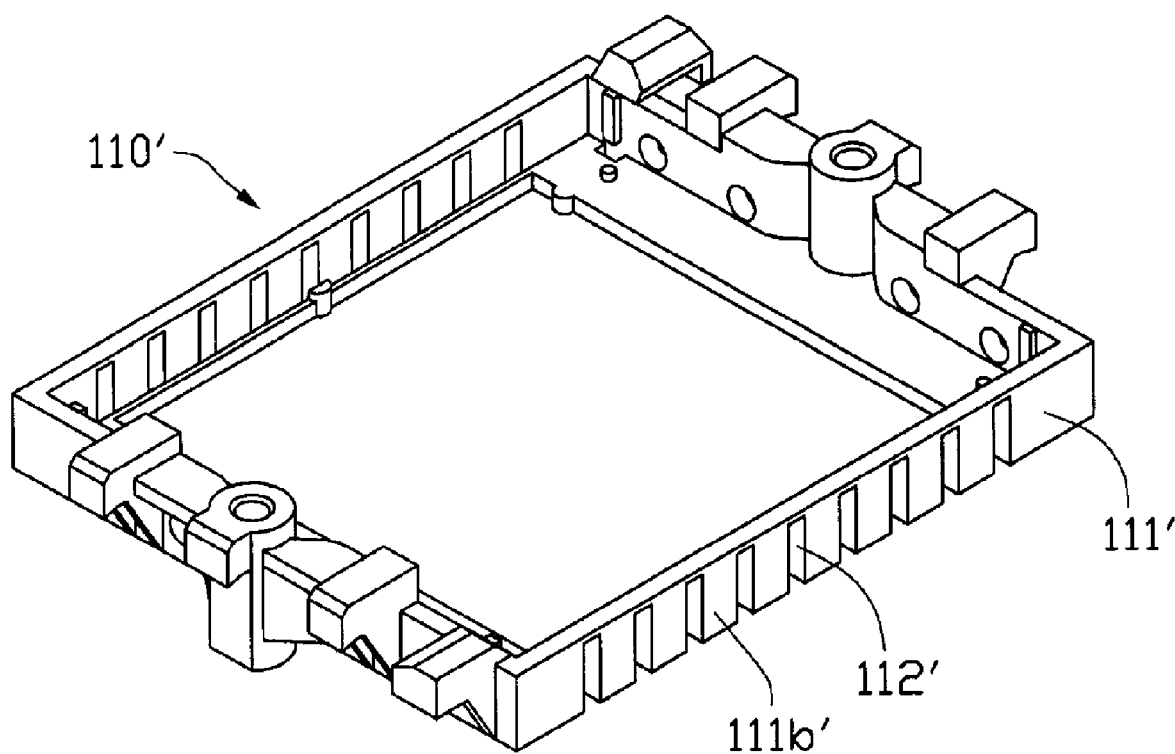
FIG. 4 is an isometric view of a retention module of a heat dissipation device in accordance with a second embodiment of the present invention.

Referring to FIG. 4, a retention module 110' of a second embodiment of the present invention is sown. The retention module 110' is similar to the retention module 110 of the first embodiment, but what is main different from the first embodiment is that a plurality of elongated slots 112' is defined in the opposite lateral second sidewalls 111*b*' of sidewalls 111' of the retention module 110'. The slots 112' are parallel to each other and extend vertically in the second sidewalls 111*b*'. A part of the airflow generated by the fan 60 and located in the heat sink 20 flows outwards through the slots 222 of the heat sink 20 and the slots 112' in the second sidewalls 111*b*' of the retention module 110' to cool the Mosfets 50 beside the lateral side of the retention module 110'.

Figure 5:
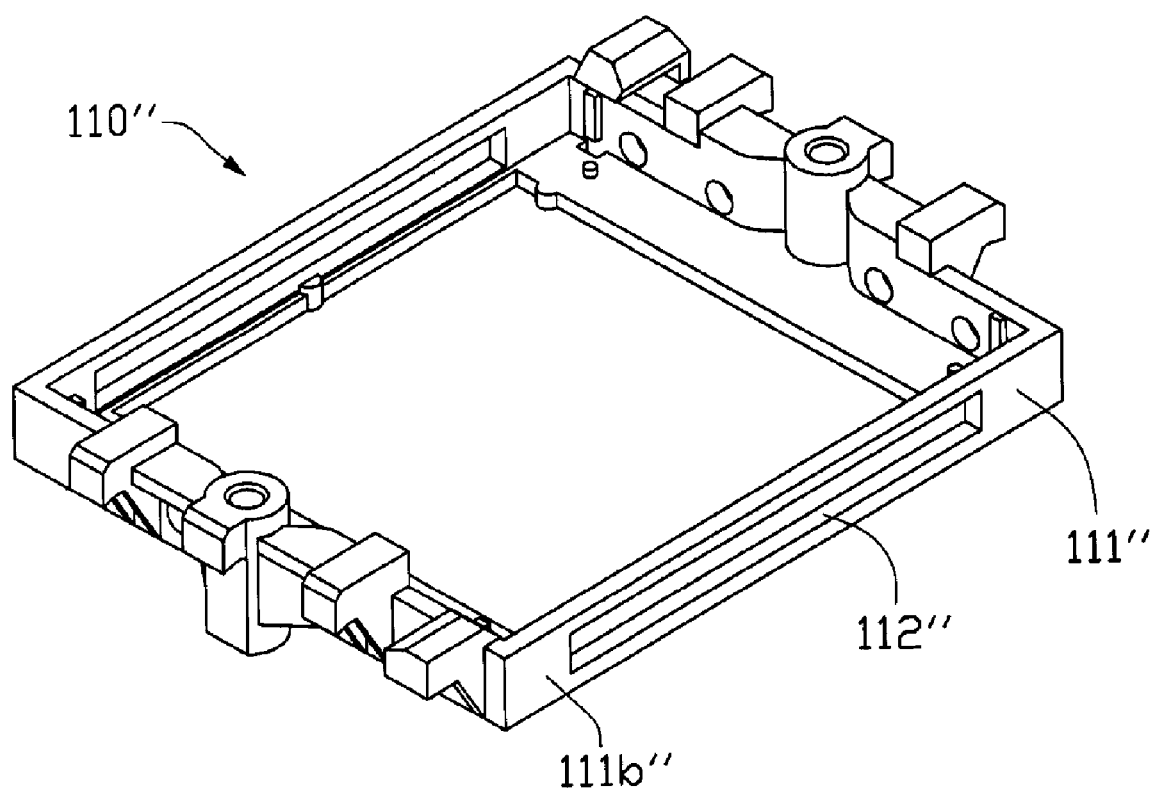
FIG. 5 is an isometric view of a retention module of a heat dissipation device in accordance with a third embodiment of the present invention.

Referring to FIG. 5, a retention module 110" of a third embodiment of the present invention is shown. The retention module 110" is similar to the retention module 110 of the first embodiment, but what is main different from the first embodiment is that the opposite lateral second sidewalls 111*b*" of sidewalls 111" of the retention module 110" respectively define through grooves 112" therein. Each of the grooves 112" extends from a front end to a rear end of each of the second sidewalls 111*b*". A part of the airflow generated by the fan 60 and located in the heat sink 20 flows outwards through the slots 222 of the heat sink 20 and the grooves 112" in the second sidewalls 111*b*" of the retention module 111" to cool the Mosfets 50 beside the lateral side of the retention module 110".

It can be understood that the present invention can have other configurations regarding the holes, slots, grooves 112, 112', 112" in the sidewalls of the retention module if only the air in the heat sink can flow outwardly through the sidewalls to cool the Mosfets 50 beside the retention module. Additionally, the present invention can have other configurations regarding the slots 222 in the heat sink if only the air in the heat sink can flow outwardly through the slots toward the sidewalls of the retention module.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a retention module comprising a bottom wall and a plurality of sidewalls surrounding the bottom wall, the sidewalls defining a plurality of passageways therein for airflow passing therethrough;
    a heat sink located on the bottom wall of the retention module, the heat sink comprising a plurality of the fins, the fins defining a plurality of passages therebetween; and
    a clip securing the heat sink to the retention module;
    wherein the sidewalls of the retention module surround a bottom portion of the heat sink, the passageways of the retention module communicate with the passages of the heat sink and ambient environment outside the retention module; and
    wherein the bottom wall of the retention module has a plurality of studs extending from a top face thereof, the heat sink being supported by the studs.

2. The heat dissipation device of claim 1, wherein two opposite sidewalls of the sidewalls respectively form two opposite protrusions from outsides thereof, and wherein the clip defines two fastening holes at two ends thereof, the protrusions of the retention module engaging in the fastening holes, respectively.

3. The heat dissipation device of claim 2, wherein each of the protrusions extends from a post formed at a center of each of the two opposite sidewalls, the post defining a fixing hole therein, and wherein the clip defines a fixing hole in alignment with the fixing hole of the post.

4. The heat dissipation device of claim 1, wherein each of two opposite sidewalls of the sidewalls has a plurality of blocks extending from an inner side thereof, the blocks engaging the heat sink therebetween.

5. The heat dissipation device of claim 1, wherein a joint of one of the sidewalls and the bottom wall of the retention module forms a projection under one of the passageways of the sidewalls.

6. The heat dissipation device of claim 1, wherein the fins of heat sink comprises two outmost fins at two opposite sides of the heat sink, and wherein the two outmost fins each defines a plurality of elongated slots therein, the slots communicating with the passages of the heat sink and ambient environment outside the heat sink.

7. The heat dissipation device of claim 6, wherein the heat sink comprises a base, the fins extending from the base, and wherein the slots of the outmost fins of the heat sink extend from a top of the outmost fins to the base, the slots communicating with the passages of the heat sink and ambient environment under the base.

8. The heat dissipation device of claim 1, wherein a fan is located atop the heat sink for providing forced airflow to the heat sink.

9. The heat dissipation device of claim 1, wherein the bottom wall of the retention module defines an opening under heat sink.

10. A retention module for retaining a heat sink therein, the retention module comprising:
    a bottom wall and a plurality of sidewalls surrounding the bottom wall, the sidewalls defining a plurality of voids therein for airflow passing therethrough;
    wherein a joint of the sidewalls and the bottom wall forms a projection thereon, the projection being located under a middle one of the voids.

11. The retention module of claim 10, wherein the bottom wall has studs extending upwardly from a top face thereof.

12. The retention module of claim 10, wherein two opposite sidewalls of the sidewalls form two opposite protrusions extending outwardly for engaging with a clip.

13. The retention module of claim 10, wherein each of two opposite sidewalls of the sidewalls forms a plurality of blocks on an inner face thereof.

14. An electronic assembly comprising:
    a printed circuit board having a main heat-generating electronic component and a secondary heat-generating electronic component mounted thereon;
    a retention module mounted on the printed circuit board, having a sidewall surrounding the main heat-generating component, the sidewall having a void through an inner surface and an outer surface thereof;
    a heat sink mounted on the retention module and in thermal contact with the main heat-generating electronic component; and
    a fan mounted on the heat sink, an air flow generated by the fan flowing through the heat sink to cool the main heat-generating electronic component, and through the void in the sidewall of the retention module from the heat sink to cool the secondary heat-generating electronic component;
    wherein the retention module comprises a bottom wall from which the sidewall extends, and from the bottom wall extends a plurality of studs supporting the heat sink thereon.

15. The electronic assembly of claim 14, wherein the void is one of a hole, a slot and a groove.

* * * * *